United States Patent
Cho et al.

(10) Patent No.: US 10,700,037 B2
(45) Date of Patent: Jun. 30, 2020

(54) REINFORCEMENT FOR ELECTRICAL CONNECTORS

(71) Applicant: Infineon Technologies AG, Neubiberg (DE)

(72) Inventors: Eung San Cho, Torrance, CA (US);
Thorsten Meyer, Regensburg (DE);
Xaver Schloegel, Sachsenkam (DE);
Thomas Behrens, Wenzenbach (DE);
Josef Hoeglauer, Heimstetten (DE)

(73) Assignee: Infineon Technologies AG, Neubiberg (DE)

( * ) Notice: Subject to any disclaimer, the term of this patent is extended or adjusted under 35 U.S.C. 154(b) by 3 days.

(21) Appl. No.: 15/811,375

(22) Filed: Nov. 13, 2017

(65) Prior Publication Data

US 2019/0148332 A1    May 16, 2019

(51) Int. Cl.
*H01L 23/00* (2006.01)
*H01L 23/498* (2006.01)

(52) U.S. Cl.
CPC ........ *H01L 24/48* (2013.01); *H01L 23/49844* (2013.01); *H01L 24/11* (2013.01); *H01L 24/16* (2013.01); *H01L 24/43* (2013.01); *H01L 24/49* (2013.01); *H01L 24/85* (2013.01); *H01L 24/13* (2013.01); *H01L 24/45* (2013.01); *H01L 24/81* (2013.01); *H01L 2224/11825* (2013.01); *H01L 2224/13082* (2013.01); *H01L 2224/16227* (2013.01); *H01L 2224/16245* (2013.01); *H01L 2224/32245* (2013.01); *H01L 2224/43825* (2013.01); *H01L 2224/45124* (2013.01); *H01L 2224/45144* (2013.01); *H01L 2224/45147* (2013.01); *H01L 2224/45565* (2013.01); *H01L 2224/4801* (2013.01); *H01L 2224/48091* (2013.01); *H01L 2224/48227* (2013.01); *H01L 2224/48247* (2013.01); *H01L 2224/48465* (2013.01); *H01L 2224/48472* (2013.01);
(Continued)

(58) Field of Classification Search
CPC ... H01L 24/28; H01L 24/49; H01L 23/49844; H01L 24/43; H01L 24/16; H01L 24/11; H01L 24/85; H01L 24/81
See application file for complete search history.

(56) References Cited

U.S. PATENT DOCUMENTS

| | | | |
|---|---|---|---|
| 6,852,567 B1 * | 2/2005 | Lee | H01L 23/3142 438/106 |
| 6,897,152 B2 * | 5/2005 | Verbunt | C23C 18/40 205/157 |

(Continued)

FOREIGN PATENT DOCUMENTS

EP    1188182 B1    8/2012

*Primary Examiner* — Allen L Parker
*Assistant Examiner* — Charles N Ausar-El
(74) *Attorney, Agent, or Firm* — Shumaker & Sieffert, P.A.

(57) ABSTRACT

In some examples, a device includes a semiconductor element, a layer element, and a single connector element electrically connecting the semiconductor element and the layer element. In some examples, the single connector element includes two or more discrete connector elements, and each discrete connector element of the two or more discrete connector elements electrically connects the semiconductor element and the layer element. In some examples, the single connector element also includes conductive material attached to the two or more discrete connector elements.

20 Claims, 12 Drawing Sheets

(52) U.S. Cl.
CPC ............... *H01L 2224/48992* (2013.01); *H01L 2224/49111* (2013.01); *H01L 2224/49175* (2013.01); *H01L 2224/73265* (2013.01); *H01L 2224/8192* (2013.01); *H01L 2224/8592* (2013.01); *H01L 2924/01013* (2013.01); *H01L 2924/01029* (2013.01); *H01L 2924/01079* (2013.01)

(56) References Cited

U.S. PATENT DOCUMENTS

| | | | | |
|---|---|---|---|---|
| 7,202,109 | B1 * | 4/2007 | Zakharian | H01L 21/568 257/E23.033 |
| 7,993,979 | B2 * | 8/2011 | Do | H01L 21/4832 438/123 |
| 2004/0014266 | A1 * | 1/2004 | Uno | B21C 37/042 438/200 |
| 2007/0290337 | A1 * | 12/2007 | Otremba | H01L 23/13 257/737 |
| 2014/0301039 | A1 * | 10/2014 | Otremba | H01L 24/36 361/689 |
| 2015/0162287 | A1 * | 6/2015 | Hosseini | H01L 24/02 257/139 |
| 2016/0148852 | A1 * | 5/2016 | Takahashi | H01L 23/053 |
| 2018/0122770 | A1 * | 5/2018 | Auchere | H01L 24/85 |
| 2019/0035771 | A1 * | 1/2019 | Iwahashi | H01L 25/07 |

* cited by examiner

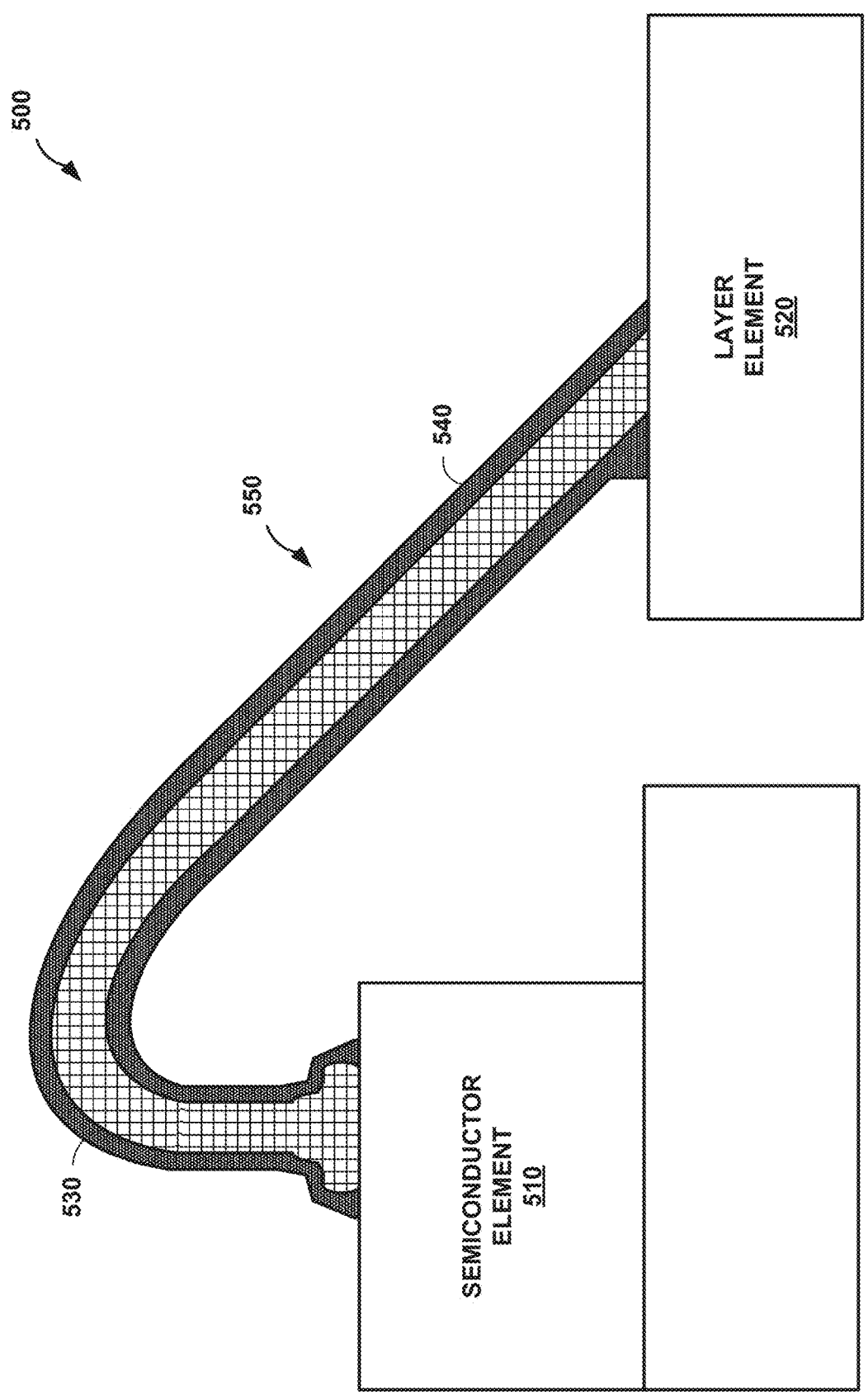

REINFORCEMENT FOR ELECTRICAL CONNECTORS

TECHNICAL FIELD

This disclosure relates to semiconductor devices, and more specifically, to semiconductor packages.

BACKGROUND

A device may include an integrated circuit and a carrier element that are electrically connected by a connector element such as a wire bond or metal pillar. The manufacturing process may include connecting the wire or pillar to the integrated circuit at a relatively high temperature. After the wire is connected, the temperature of the device may be reduced, causing the integrated circuit and the wire or pillar to thermally contract.

The integrated circuit and the wire or pillar may be configured to thermally contract at different rates because each element may include different materials. For example, the integrated circuit may include silicon with a much lower coefficient of thermal expansion (CTE) than the wire or pillar, which may include metal. As a result, the wire or pillar may thermally contract more than the integrated circuit, causing stress at the interface between the integrated circuit and the wire or pillar.

SUMMARY

This disclosure describes techniques for forming an electrical connection between a semiconductor element and a layer element. The electrical connection may include two or more discrete connector elements, where each discrete connector element electrically connects the semiconductor element and the layer element. Conductive material may be formed on the two or more discrete connector elements to form a single connector element. The conductive material may be formed on the two or more discrete connector elements after the two or more discrete connector elements are electrically connected to the semiconductor element and after the two or more discrete connector elements are electrically connected to the layer element.

In some examples, a device includes a semiconductor element, a layer element, and a single connector element electrically connecting the semiconductor element and the layer element. The single connector element includes two or more discrete connector elements, and each discrete connector element of the two or more discrete connector elements electrically connects the semiconductor element and the layer element. The single connector element also includes conductive material attached to the two or more discrete connector elements.

In some examples, a method includes electrically connecting each discrete connector element of two or more discrete connector elements to a layer element. The method also includes electrically connecting each discrete connector element of the two or more discrete connector elements to a semiconductor element. The method further includes forming conductive material on the two or more discrete connector elements after electrically connecting the two or more discrete connector elements to the layer element and after electrically connecting the two or more discrete connector elements to the semiconductor element. Forming the conductive material comprises forming a single connector element to electrically connect the semiconductor element and the layer element.

In some examples, a device includes a semiconductor element, a layer element, and a single connector element electrically connecting the semiconductor element and the layer element. The single connector element includes two or more discrete connector elements, wherein each discrete connector element of the two or more discrete connector elements is electrically connected to a pad on the semiconductor element and electrically connected to the layer element. The single connector element includes conductive material formed on each discrete connector element of the two or more discrete connector elements, the pad on the semiconductor element, and the layer element.

The details of one or more examples are set forth in the accompanying drawings and the description below. Other features, objects, and advantages will be apparent from the description and drawings, and from the claims.

BRIEF DESCRIPTION OF DRAWINGS

FIG. 5 is a side-view diagram of conductive material attached to a wire bond, in accordance with some examples of this disclosure.

DETAILED DESCRIPTION

Figure 1:
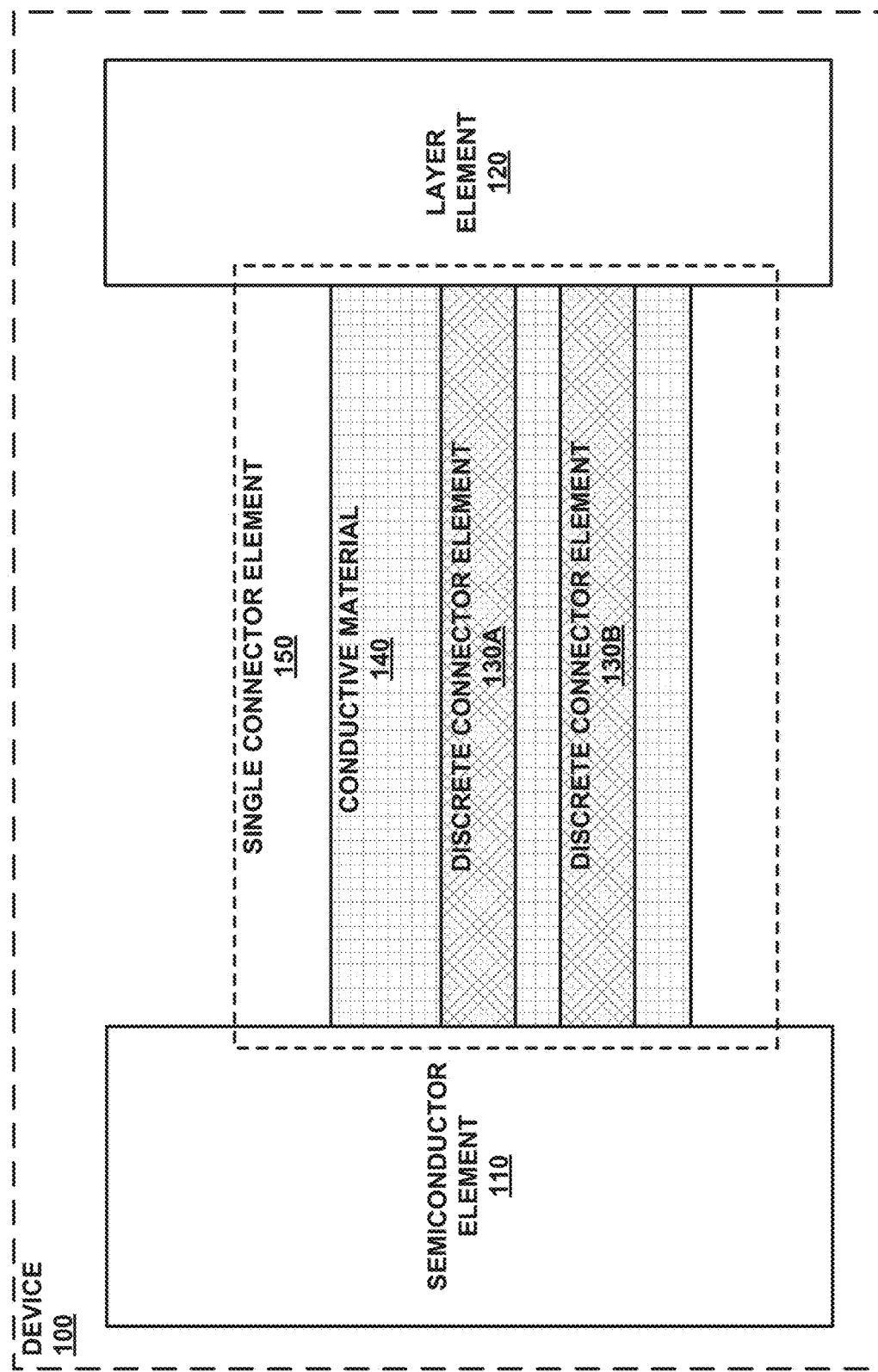
FIG. 1 is a conceptual block diagram of a device including a single connector element electrically connecting a semiconductor element and a layer element, in accordance with some examples of this disclosure.

This disclosure is directed to a device and a process for forming a connector element between two elements, such as a semiconductor element and a layer element. The connector element may include two or more discrete connector elements with conductive material formed on the discrete connector element. In some examples, a single, larger connector element may be formed from two or more discrete connector elements and the conductive material. The larger connector element may have better electrical, thermal, and mechanical characteristics, as compared to the discrete connector element(s) within the connector element. In addition, the process of forming conductive material on one or more discrete connector element(s) may result in lower stress on the semiconductor element and layer element, as compared to attaching a single, larger pre-formed connector element to the semiconductor element.

To assemble another device, a copper wire with a diameter of one hundred micrometers is connected to a semiconductor element with relatively brittle material such as gallium nitride (GaN) or silicon carbide (SiC). The connection process may involve temperature changes that cause the wire to expand and contract at different rates relative to the expansion and contraction of the semiconductor material. The rates of expansion and contraction may be based on the coefficient of thermal expansion (CTE) of each material. The relative expansion and contraction may cause stress and damage to the semiconductor material.

In contrast, a device of this disclosure may include one or more wires with a diameter of thirty micrometers that may be connected to a semiconductor element. The smaller diameter of the wire may cause less stress to the semiconductor element during the thermal expansion and contraction caused by the connection process. Then, conductive material may be formed on the wire to create a single connector element with a diameter of one hundred micrometers. The process of forming the conductive material on the one or more wires may not cause significant stress to the semiconductor element. The thermal, electrical, and mechanical characteristics of the single connector element with a diameter of one hundred micrometers may be similar to the characteristics of a wire of one hundred micrometers, but the assembly process of the device of this disclosure may cause less stress to the semiconductor element.

The dimensions described herein are examples for explaining the techniques of this disclosure. For example, a wire with a diameter of one hundred micrometers may be plated up to a larger diameter in the same manner as described for smaller wires. In addition, these techniques also apply to other connector elements such as pillars, bumps, and balls. Forming conductive material on a pillar, bump, or ball may improve the characteristics of the connector element while limiting the stress caused by attaching the connector element to a semiconductor element.

In some examples, materials with higher malleability than copper such as gold or aluminum may be used in the one or more wires to reduce the stress caused by an attachment process. However, copper may have lower resistivity than other conductive materials such as solder or aluminum. The relatively low resistivity of copper may result in lower power dissipation and less heat generated during the operation of a device. The techniques of this disclosure may also apply to pillars, bumps, balls, and any other connector elements. Conductive material may be formed on connector elements such as pillars, bumps, and balls to improve the electrical, thermal, and/or mechanical characteristics of the connector elements.

FIG. 1 is a conceptual block diagram of a device 100 including a single connector element 150 electrically connecting a semiconductor element 110 and a layer element 120, in accordance with some examples of this disclosure. Device 100 may be part of a power electronics system, a digital and/or analog system, a computer system, an electronic device, and/or any other application. In some examples, device 100 may include more than one semiconductor element, more than one layer element, and/or more than one single connector element.

Semiconductor element 110 may include one or more electrical components such as transistors, diodes, capacitors, and the like. In some examples, semiconductor element 110 may include one or more power transistors configured to receive electrical power from layer element 120 or deliver electrical power to layer element 120. Semiconductor element 110 may include semiconductor material, such as silicon, germanium, gallium, arsenic, GaN, SiC, and/or any other semiconductor material. GaN and SiC may be relatively brittle, as compared to silicon, and thus more susceptible to damage during the process of electrically connecting discrete connector elements 130A and 130B to semiconductor element 110. GaN and SiC are wide-bandgap materials that may support higher switching frequencies than silicon or gallium arsenide.

Layer element 120 may include a carrier, a metal layer, a molded interconnect substrate (MIS), a laminated substrate, a ceramic material, a direct-copper-bonded (DCB) substrate, an active-metal-brazed (AMB) substrate, a printed circuit board (PCB), and/or any other layer element. Layer element 120 may be configured to conduct electricity at a reference voltage such as reference ground, at a high-side power supply voltage, or at a low-side power supply voltage. Layer element 120 may operate as an electrical connection between semiconductor element 110 and another component of device 100, such as another semiconductor element or an input/output node (e.g., a pin, a pad, an exposed slug, or a lead).

Discrete connector elements 130A and 130B may be electrically connected to elements 110 and 120 and configured to conduct electricity between elements 110 and 120. Discrete connector elements 130A and 130B may be attached to a pad located on semiconductor element 110. Discrete connector elements 130A and 130B may include a metal wire, a metal pillar, a conductive bump, or a conductive ball. Discrete connector elements 130A and 130B may include copper, gold, aluminum, solder, and/or any other conductive material. Discrete connector elements 130A and 130B may be attached to elements 110 and/or 120 using a process such as wire bonding, soldering, gluing, taping, adhered, or any other attaching process.

In some examples, device 100 may include two or more discrete connector elements, such as wires, pillars, bumps, etc. Each of the two or more discrete connector elements may be electrically connected to elements 110 and 120. Thus, each of the two or more discrete connector elements may operate as a parallel connection between elements 110 and 120. Each discrete connector element may be a discrete component before the discrete connector element is electrically connected to elements 110 and 120. After being electrically connected to elements 110 and 120, a discrete connector element may physically contact another discrete connector element at some points along the lengths of the two discrete connector elements.

There may be many desirable characteristics for the electrical connection between elements 110 and 120. For example, low electrical resistance between elements 110 and 120 may reduce the power dissipation of electricity flowing between elements 110 and 120. Low power dissipation may be desirable to improve the efficiency of device 100 and reduce the amount of heat generated in an around discrete connector elements 130A and 130B. In addition, the electrical connection between elements 110 and 120 may operate as a heat sink by transferring heat away from semiconductor element 110, which may generate heat during the operation of device 100. Thus, a large cross-sectional area of the electrical connection between elements 110 and 120 may increase the conduction of heat away from semiconductor element 110. Furthermore, a large cross-sectional area of the electrical connection between elements 110 and 120 may be stronger than an electrical connection with a smaller cross-sectional area.

Conductive material 140 may be formed on discrete connector elements 130A and 130B using a process such as electrolytic plating, electroless plating, and/or spray coating. Conductive material 140 may include copper, nickel, silver, and/or any other conductive material that can be formed on discrete connector elements 130A and 130B. In some examples, there may be two or more layers of conductive material 140, such as a layer of copper to increase conductivity (e.g., lower resistance) and a layer of nickel to prevent corrosion.

In accordance with the techniques of this disclosure, single connector element 150 includes discrete connector elements 130A and 130B and conductive material 140. Single connector element 150 may have better electrical, thermal, and mechanical characteristics, as compared the characteristics to discrete connector elements 130A and 130B without conductive material 140. The process of attaching discrete connector elements 130A and 130B to semiconductor element 110 may cause relatively low stress to semiconductor element 110, as compared to attaching a discrete connector element with the dimensions of single connector element 150. Soldering or wire bonding a discrete connector element with the dimensions of single connector element 150 to semiconductor element 110 may cause relatively high stress to semiconductor element 110 because, for example, the thermal expansion and thermal contraction is proportional to the dimensions of discrete connector elements 130A and 130B.

In contrast, the process of forming conductive material 140 on discrete connector elements 130A and 130B may cause little or no stress to semiconductor element 110. Therefore, in order to form single connector element 150 with relatively large dimensions, an assembly process may include attaching relatively thin discrete connector elements 130A and 130B and then forming conductive material 140 to increase the cross-sectional area of the electrical connection between elements 110 and 120 (e.g., single connector element 150). Constructing single connector element 150 by forming conductive material 140 may result in less overall stress to semiconductor element 110, as compared to wire bonding or soldering a large discrete connector element to semiconductor element 110, where the large discrete connector element has the same dimensions as single connector element 150.

Figure 2A:
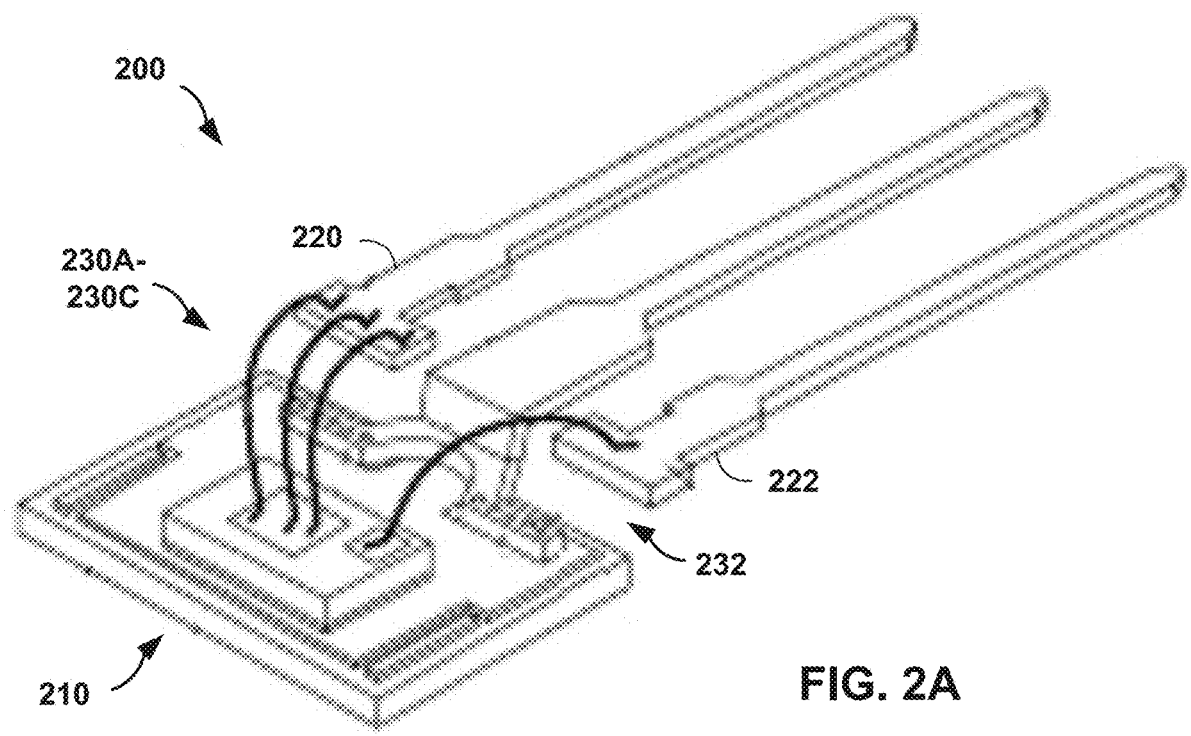
FIGS. 2A and 2B are perspective-view diagrams of connector elements electrically connecting a semiconductor element and a layer element, in accordance with some examples of this disclosure.
Figure 2B:
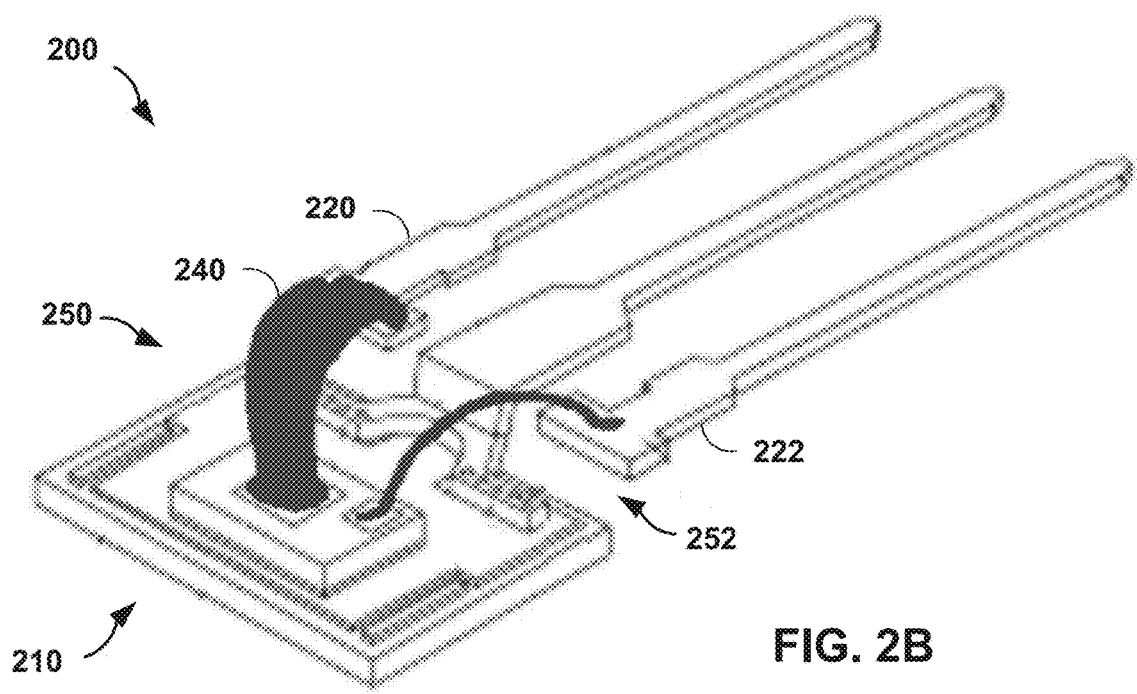

FIGS. 2A and 2B are perspective-view diagrams of connector elements 230A-230C and 250 electrically connecting a semiconductor element 210 and a layer element 220, in accordance with some examples of this disclosure. Semiconductor element 210 includes a first pad electrically connected to layer element 220 by connector elements 230A-230C and a second pad electrically connected to layer element 222 by connector element 232. In some examples, the first pad may be electrically connected to a load terminal (e.g., a drain terminal or an emitter terminal) of a power transistor of semiconductor element 210, and the second pad may be electrically connected to a control terminal (e.g., a gate terminal). Conductive material 240 may be formed around connector elements 230A-230C to form connector element 250 and around connector element 232 to form connector element 252.

Device 200 includes a power semiconductor package that may include wire bonding between elements as a first-level interconnect technology. The current carrying capability of connector elements 230A-230C and 250 may be a major important characteristic of power packages. One technique for increasing current carrying capability is to increase the diameter of the wire or other connector element. Another technique is to select a wire material with lower electrical resistance. Yet another technique is to bond multiple wires to the same contacts, as shown with discrete connector elements 230A-230C in FIG. 2A. A ribbon may also be bonded to the contacts, where the ribbon has the dimensions of a thick wire.

An important aspect of power packages such as device 200 may be the thermal dissipation of the elements. The wire bonds of connector elements 230A-230C may not remove much of the heat generated by semiconductor element 210 due to the relatively small diameter of connector elements 230A-230C. The bulk material of semiconductor element 210, which may include a GaN chip, may be relatively brittle. Therefore, connector elements 230A-230C may be designed to have mechanically low stress interconnect to avoid damage to semiconductor element 210. Therefore, the wire bond interconnects of connector elements 230A-230C may not be placed over the active area(s) of semiconductor element 210. It may be more expensive in terms of the FE processing to place connector elements 230A-230C over non-active area(s) of semiconductor element 210. Thus, the low-stress interconnect techniques of this disclosure may reduce the cost of a semiconductor product by possibly allowing bonding to active areas because of the lower stress of bonding a small-diameter wire.

Connector elements 230A-230C may include three wires that are bonded to the same connection for high-power interconnections. In some examples, there may be a different number of connector elements to electrically connect semiconductor element 210 and layer element 220. Connector elements 230A-230C may be configured to handle high-power currents and/or low-power currents. FIG. 2A depicts three thick bond wires for the connection to the pad for a load terminal (e.g., the emitter) of semiconductor element 210, while only one thin wire is connecting the gate pad of semiconductor element 210. Connector elements 230A-230C may be wedge-bonded to elements 210 and 220.

If semiconductor element 210 includes GaN, the bond pads may be located over the non-active areas of device 200 in order to not destroy or mechanically damage the GaN substrate and the sensitive structures of semiconductor element 210. Another technique to lower the stress of bonding is to use multiple wires instead of one large wire. Semiconductor element 210 may include top-side cooling or double-sided cooling approaches to remove heat from semiconductor element 210. The heat generated by semiconductor element 210 may transfer through die-attach material into a heat sink, which may be part of the package or attached to the package. For double-sided cooling, both sides of the power components of semiconductor element 210 may be attached to a cooling heat sink.

Using multiple wires, as shown in FIG. 2A, may have the disadvantage of lower current carrying capability and lower thermal carrying capability because of the limited diameter of the wires. As compared to connector element 250 depicted in FIG. 2B, connector elements 230A-230C may have unused space between each connector element. Connector element 250 may have a larger diameter than connector elements 230N-230C, which may result in higher current carrying capability and higher thermal carrying capability. Connector elements 230A-230C may take up a relatively large space, both on semiconductor element 210 and on the pad on semiconductor element 210, which may increase the cost of front-end (FE) production (e.g., semiconductor production) and back-end (BE) production (e.g., package production). For a semiconductor element 210 including GaN, the artificial increase of chip size for the first-level interconnect element may cause a higher cost in FE. Special cooling approaches may be complex and may not always be feasible, creating a need for a connector element that dissipates more heat.

The techniques of this disclosure include using multiple discrete connector elements such as wire bonds or metal pillars. Discrete connector elements 230A-230C may have a relatively small distance between each other in order to improve the process of forming conductive material 240 around discrete connector elements 230A-230C. Forming the conductive material 240 may include a plating process or other formation process to interconnect the wires to connector element 250 (e.g., one "wire cable") with a potentially larger contact area on the pad of semiconductor element 210. The bonding and plating processes may include low-mechanical-stress wire bond parameters in order not to damage the substrate (e.g., semiconductor element 210), which may include silicon carbide or GaN, and other structures.

As shown in FIG. 2B, connector element 250 may have no isolation or gap between each of connector elements 230A-230C. A process of forming connector element 250 from connector elements 230A-230C may include electro-plating or electroless plating of copper, silver, and/or any other conductive material. Connector element 250 may include a larger diameter than each of connector elements 230A-230C. In addition, the interconnect area for connector element 250 may be larger than the combined interconnect area for all of connector elements 230A-230C.

The larger interconnect cross-sectional area of connector element 250 may result in better electrical and thermal performance due to removal of isolation (e.g., gap) between connector elements 230A-230C by conductive material 240 (e.g., copper). Connector element 250 may also include a larger area of possible interconnect on the pad of semiconductor element 210 and the pad of layer element 220 for better thermal and electrical performance. In addition, electrically connecting discrete connector elements 230A 230C before forming conductive material 240 on connector elements 230A 230C may lower the stress on semiconductor element 210 due to the bonding process, as compared to bonding connector element 250 as a single step. Connector element 250 may also experience less pad corrosion and less bond-hollow-induced cracking. Connector element 250 may form a better angle between the pad as compared to ribbon bonding.

Device 200 may include a carrier or substrate underneath semiconductor element 210. Semiconductor element 210 may be attached to the substrate by a die-attach method such as soldering or gluing. After the die-attach step; connector elements 230A-230C may be electrically connected to elements 210 and 220. If connector elements 230A-230C include wires, the electrical connection process may include wire bonding (e.g., ball bonding or wedge bonding). Next, conductive material such as copper or copper-coated material may be formed on connector elements 230A-230C. Copper and/or copper-coated material may have relatively low cost and may be easily plated, as compared to other bonding materials.

Figure 2C:
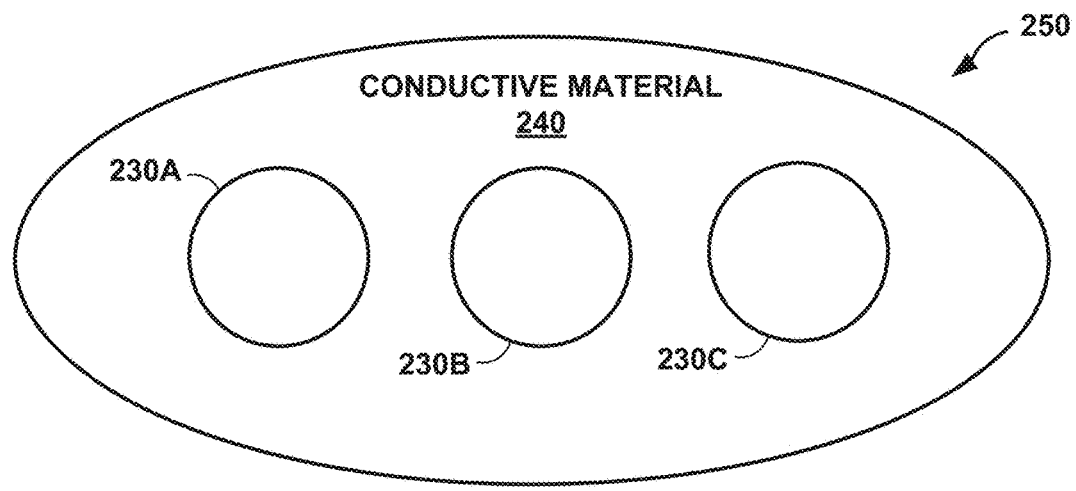
FIGS. 2C and 2D are cross-sectional diagrams of single connector elements including three discrete connector elements and conductive material, in accordance with some examples of this disclosure.
Figure 2D:
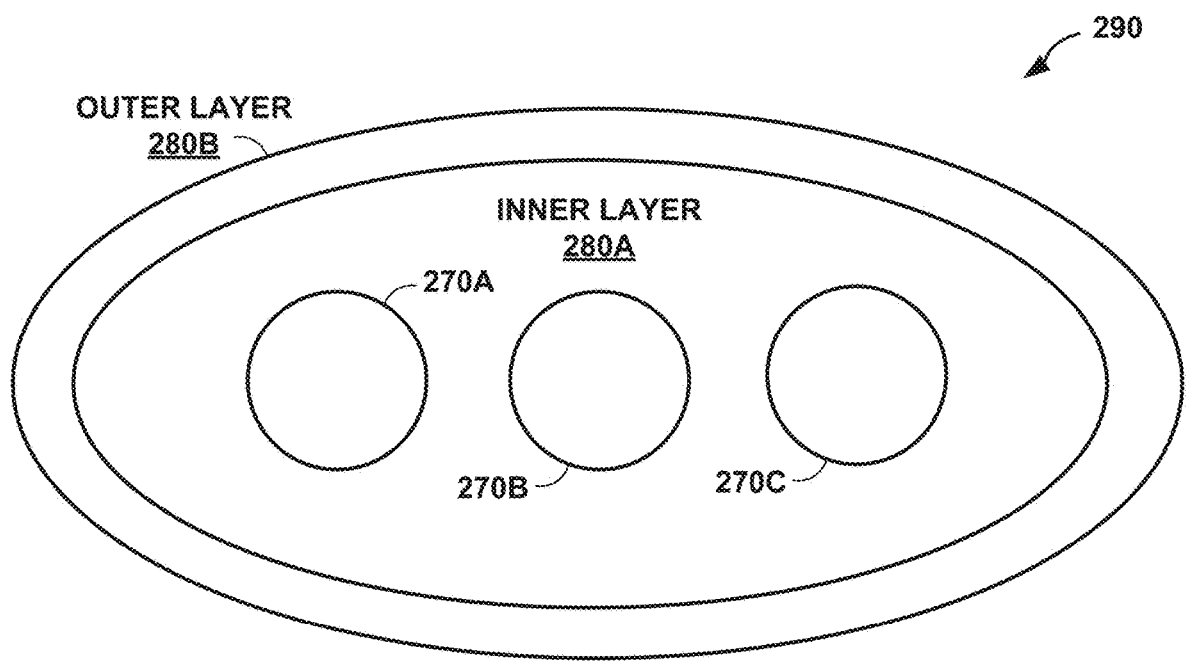

FIGS. 2C and 2D are cross-sectional diagrams of a single connector elements 250 and 290 including three discrete connector elements 230A-230C and 270A-270C and conductive material 240, 280A, and 280B, in accordance with some examples of this disclosure. FIG. 2C depicts a cross section of connector element 250 taken at, for example, halfway along connector element 250 between elements 210 and 220. Each of connector elements 230A-230C may include a diameter between twenty micrometers and one hundred micrometers, between thirty micrometers and eighty micrometers, or between forty micrometers and seventy micrometers. The diameter of connector element 250 may be larger, such as between one hundred micrometers and five hundred micrometers or between one-hundred-and-fifty micrometers and three hundred micrometers.

FIG. 2D illustrates an example single connector element 290 that includes two layers 280A and 280B of conductive material. Inner layer 280A may be formed before outer layer 280B is formed. Inner layer 280A may include a conductive material with low resistivity to improve the electrical characteristics of single connector element 290. Outer layer 280B may include a conductive material that impedes corrosion such as nickel or silver.

Figure 3A:
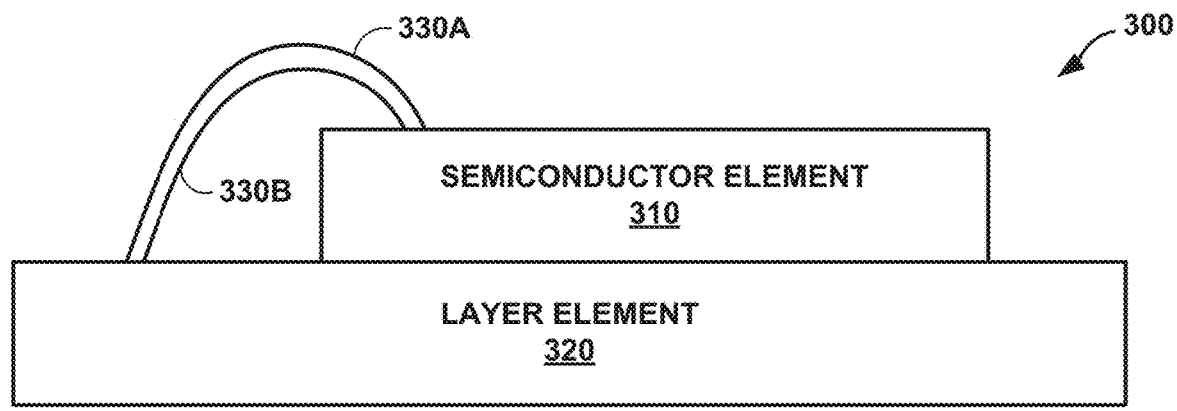
FIGS. 3A-3C are conceptual block diagrams of a device including wire bonds electrically connecting a semiconductor element and a layer element, in accordance with some examples of this disclosure.
Figure 3B:
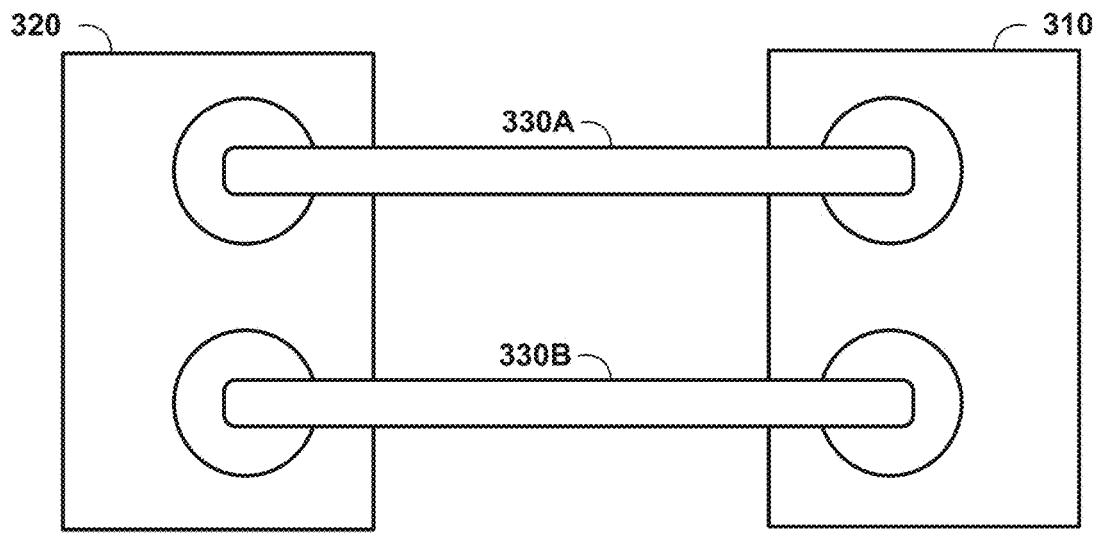
Figure 3C:
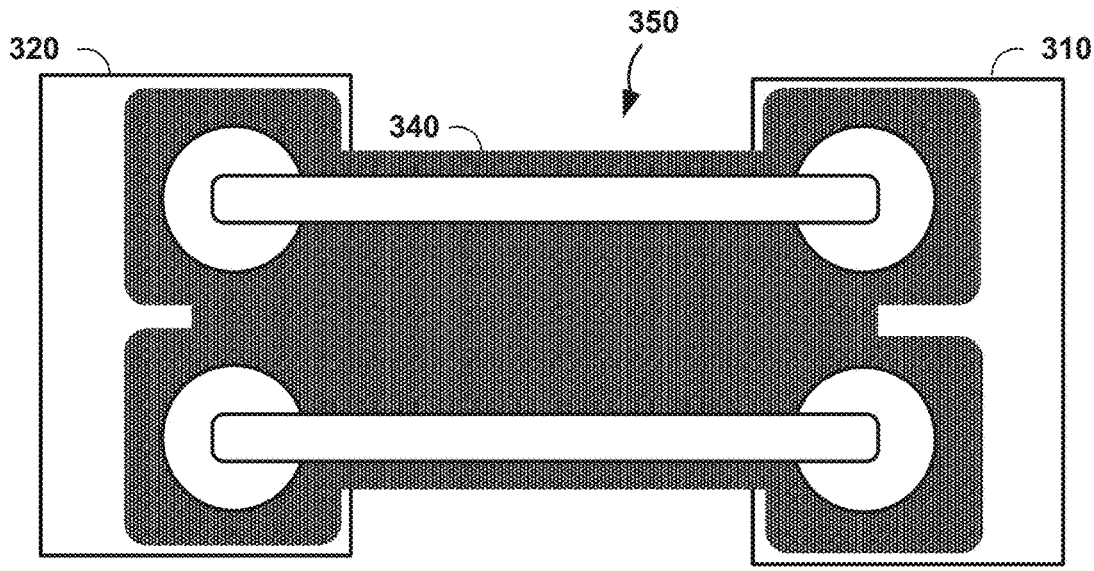

FIGS. 3A-3C are conceptual block diagrams of a device 300 including wire bonds 330A and 330B electrically connecting a semiconductor element 310 and a layer element 320, in accordance with some examples of this disclosure. Wire bonds 330A and 330B are an example of connector elements. Other examples of connector elements include conductive pillars and conductive bumps.

FIG. 3C depicts connector element 350 including wire bonds 330A and 330B and conductive material 340. In some examples, each of wire bonds 330A and 330B may be electrically connected to elements 310 and 320 before conductive material 340 is formed on wire bonds 330A and 330B. The process of electrically connecting wire bonds 330A and 330B to elements 310 and 320 may include wire bonding, gluing, taping, attaching, and/or any other means of attaching wire bonds 330A and 330B to elements 310 and 320. The process of electrically connecting wire bonds 330A and 330B to elements 310 and 320 may include relatively high temperatures, which may cause the materials of wire bonds 330A and 330B and elements 310 and 320 to expand at different rates based on the CTE of each material. When the temperature declines, the materials may contract at different rates based on the CTE of each material. The different rates of expansion and contraction may cause stress to the components of device 300.

The dimensions (e.g., diameter) of connector elements 330A, 330B, and 350 may be larger near the surface of semiconductor element 310 and near the surface of layer element 320. The portions of wire bonds 330A and 330B near elements 310 and 320 may be referred to as the "balls" or "ball bonds" of wire bonds 330A and 330B (see, e.g., ball bond 432 in FIGS. 4A and 4B).

Figure 4A:
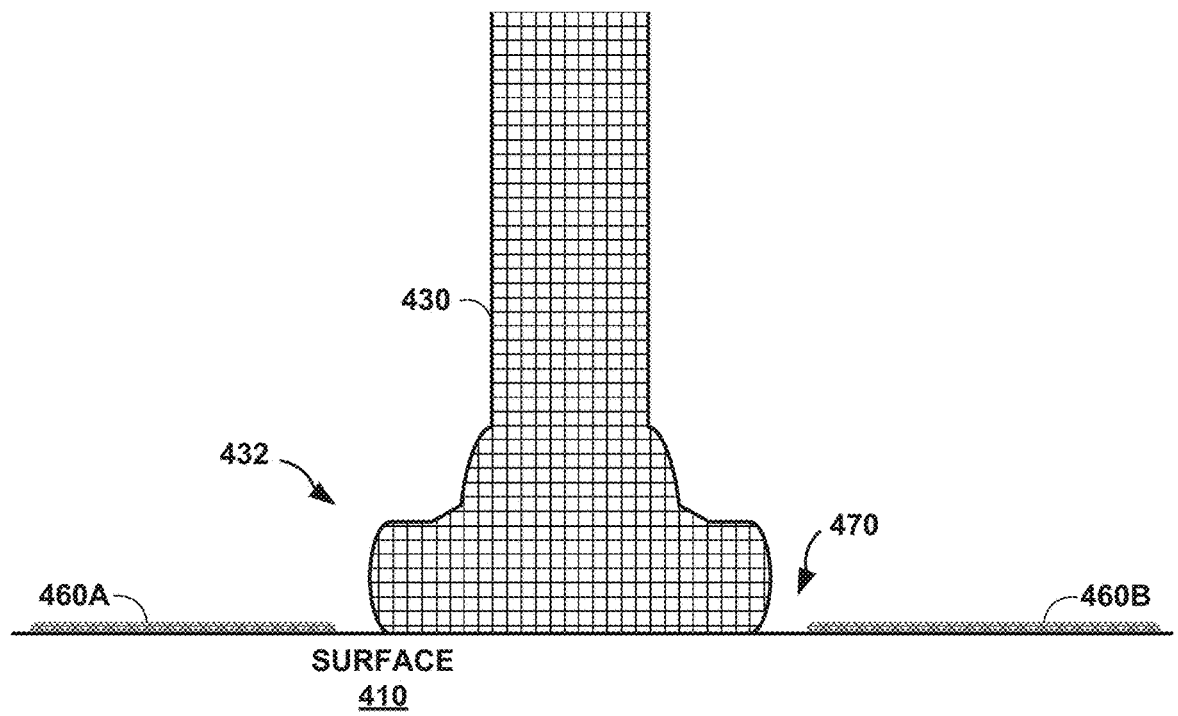
FIGS. 4A and 4B are side-view diagrams of a wire bond before and after conductive material is attached to the wire bond, in accordance with some examples of this disclosure.
Figure 4B:
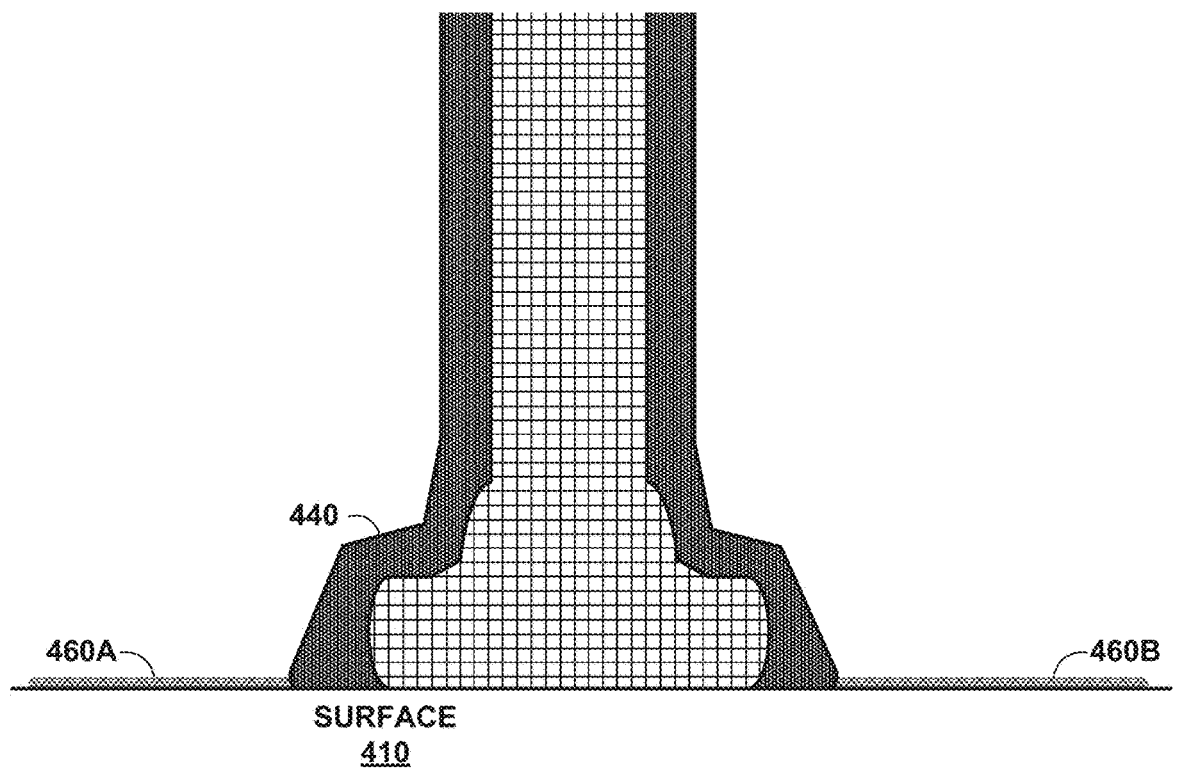

FIGS. 4A and 4B are side-view diagrams of a wire bond 430 before and after conductive material 440 is attached to the wire bond 430, in accordance with some examples of this disclosure. Wire bond 430 is one example of a connector element and may include a metal such as copper, aluminum, gold, or any other conductive material. Conductive material 440 may be formed around wire bond 430 to create a single connector element that is larger than wire bond 430 and may have better electrical, thermal, and mechanical properties.

Conductive material 440 may include copper, silver, nickel, palladium, or any other conductive material. In some examples, conductive material 440 may include multiple layers of material, such as a first layer of copper and a second layer of nickel. There may be an interface between connector element 430 and conductive material 440, except if both connector element 430 and conductive material 440 are the same material, which may cause the interface to disappear. Copper wire may cause higher stress to surface 410 during a bonding, and/or attaching process, so it may be desirable to use aluminum or gold for wire bond 430 if surface 410 includes brittle material such as Gail.

Conductive material 440 such as copper can be formed on wire bond 430 by, for example, electroplating, which may not cause as much stress to surface 410 as connecting wire bond 430 to surface 410. Copper material may be harder and less malleable than gold material and aluminum material. Thus, bonding, and/or attaching a gold wire or aluminum wire to surface 410 may not result in stress as high as bonding, and/or attaching a copper wire to surface 410. However, the hardness of copper in conductive material 440 may not necessarily be a significant factor in causing stress to surface 410 during the forming process of conductive material 440 on wire bond 430.

Wire bond 430 is electrically connected to surface 410, which may include a pad on a semiconductor element or a layer element. Conductive material 440 may reinforce ball bond 432 of wire bond 430. In some examples, conductive material 440 may be used to plate or cover only connector element 430, instead of forming multiple connector elements into a single connector element (e.g., a band or a ribbon). Conductive material 440 (e.g., the plated copper) may not only increase the diameter of connector element 430 and the ball (i.e., the portion of connector element 430 nearest surface 410), conductive material 440 may also increase the contact area to the bond pad on surface 410. The increased contact area may reduce the occurrence of corrosion on the die pad.

The increased contact area between surface 410, ball bond 432, and conductive material 440 may improve the thermal dissipation for surface 410. A thick layer of conductive material 440 at surface 410 may allow heat to quickly transfer from surface 410 to wire bond 430 and conductive material 440. In some examples, there may be a layer of aluminum at surface 410 covered by a layer of copper, and attaching ball bond 432 to the aluminum may allow thermal dissipation through ball bond 432 and conductive material 440.

Crack induction may occur in a hollow space between connector element 430 and the pad on surface 410. Cracks may occur because of power cycling in the device. For example, a switch in a semiconductor element may turn on and off at a high frequency, causing the flow of electricity through wire bond 430 to start and stop at a high frequency. One technique for avoiding crack induction is to attach a small amount of polyimide material into the hollow space. The polyimide material may be dispensed or jetted into the hollow space. Corrosion may also occur beneath and around ball bond 432 of connector element 430. Forming conductive material 440 on connector element 430 may also reduce the likelihood of cracks and corrosion near the interface between surface 410 and connector element 430.

In some examples, there may be two layers of conductive material 440 formed on connector element 430. For example, a layer of conductive material 440 such as copper may be formed on connector element 430 in order to increase the current carrying capability and to improve the thermal dissipation for surface 410. Then, a layer of conductive material 440 such as nickel may be formed on the first layer of conductive material 440 (e.g., the copper layer) in order to prevent corrosion on connector element 430 and at the interface of surface 410 and connector element 430.

Forming conductive material 440 around ball bond 432 may create a smooth interface between surface 410 and ball bond 432. The smooth interface may result in a decrease in the electrical resistance at the interface, as compared to the interface shown in FIG. 4A without conductive material 440. A lower resistance may result in lower power dissipation, thereby increasing the efficiency of the device. Lower power dissipation may result in lower heat generation, thereby improving the thermal performance of the device.

FIGS. 4A and 4B depict areas 460A and 460B of pad as still intact. Area 470 of the pad may be corroded because area 470 is near ball bond 432. Conductive material 440 may cover area 470 to prevent or reduce the corrosion in area 470. The pad (e.g., areas 460A and 460B) may include aluminum or another conductive material.

FIG. 5 is a side-view diagram of conductive material 540 attached to a wire bond 530, in accordance with some examples of this disclosure. For high-electron-mobility (NM) substrates (e.g., GaN), bonding on active area(s) may not be feasible because of the brittleness of the substrate material. The silicon die may be "artificially" enlarged to make space for wire bond pads on semiconductor element 510. The substrate material of semiconductor element 510 may be too brittle such that the material of semiconductor element 510 may be damaged by the mechanical stress during wire bonding. Low-stress bonding with over-plating may achieve a final electrical, thermal, and mechanical contact between elements 510 and 520 and may allow for bonding on the active area of semiconductor element 510 for HEM materials.

Attaching a thirty-micrometer-diameter wire to semiconductor element 510 may result in lower stress, as compared to attaching a fifty-micrometer-diameter wire to semiconductor element 510. If the attachment process occurs on an active area of semiconductor element 510, the attachment process may damage or destroy semiconductor element 510. Attaching a thirty-micrometer-diameter wire (e.g., connector element 530) and then plating up conductive material 540 to form single connector element 550 with a diameter of fifty micrometers may result in similar characteristics to a discrete connector element with a diameter of fifty micrometers.

In some examples, electrolytic plating and/or electroless plating can be used to form conductive material 540 on connector element 530. If electroplating is used, horizontal as well as vertical plating principles can be applied. Layer element 520 can be masked by a permanent mask, such as a rubber mask that is mechanically attached to layer element 520. Layer element 520 can also be masked by a temporary mask, such as plating resist, which can be removed by wet chemistry after the electro-plating process is complete.

Figure 6:
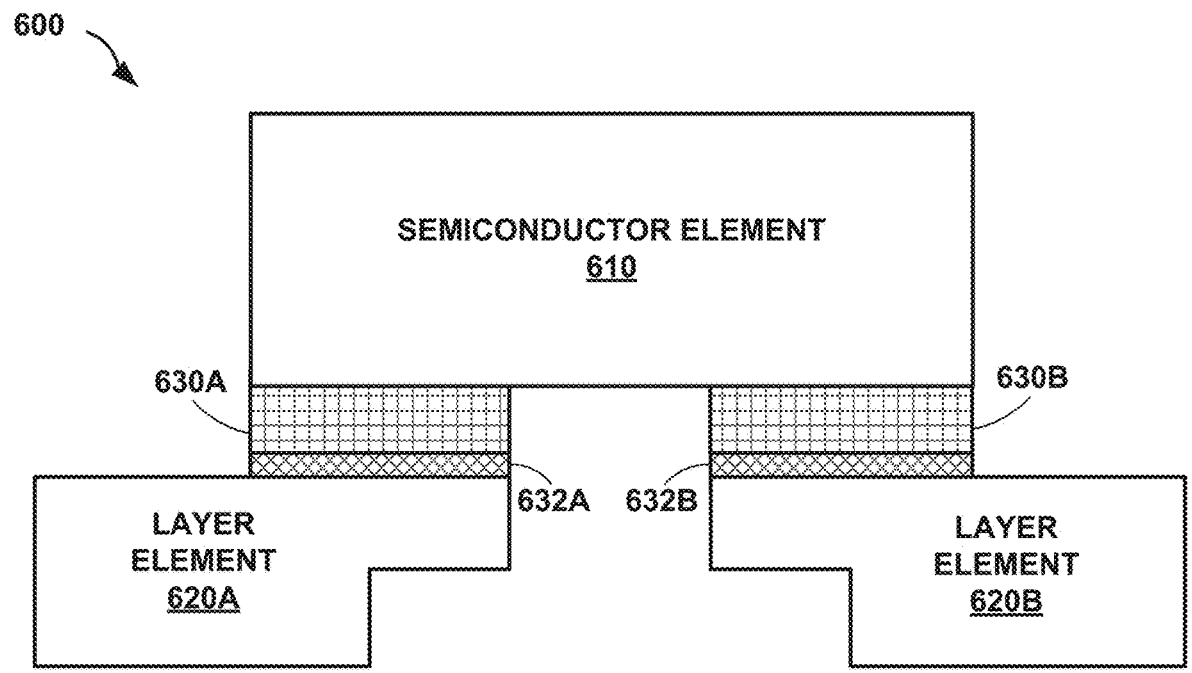
FIG. 6 is a conceptual block diagram of two large pillars electrically connecting a semiconductor element and two layer elements, in accordance with some examples of this disclosure.

FIG. 6 is a conceptual block diagram of two large pillars 630A and 630B electrically connecting a semiconductor element 610 and two layer elements 620A and 620B, in accordance with some examples of this disclosure. Pillars 630A and 630B may include material such as copper, aluminum, or another metal. Pillars 630A and 630B may be attached to elements 610, 620A, and 620B by soldering or another attachment process. Attachment material 632A and 632B may include solder or adhesive material such as tape or glue. Device 600 may also include attachment material between semiconductor element 610 and pillars 630A and 630B.

Figure 7A:
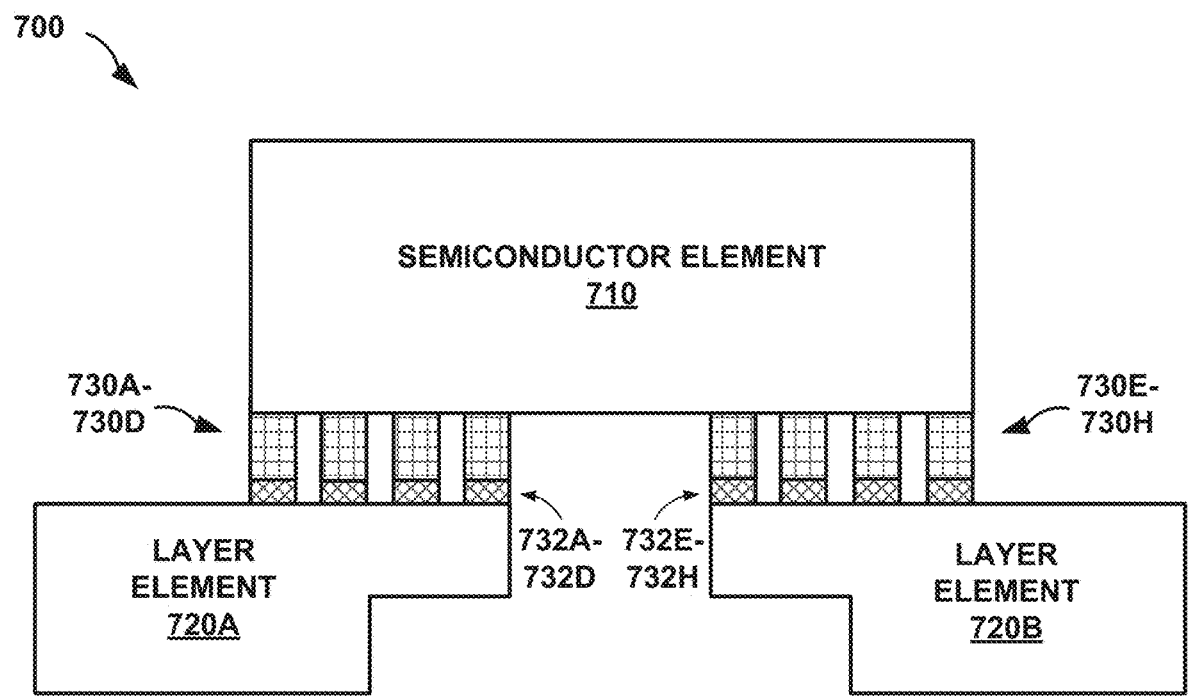
FIGS. 7A-7C are conceptual block diagrams of eight smaller pillars electrically connecting a semiconductor element and two layer elements, in accordance with some examples of this disclosure.
Figure 7B:
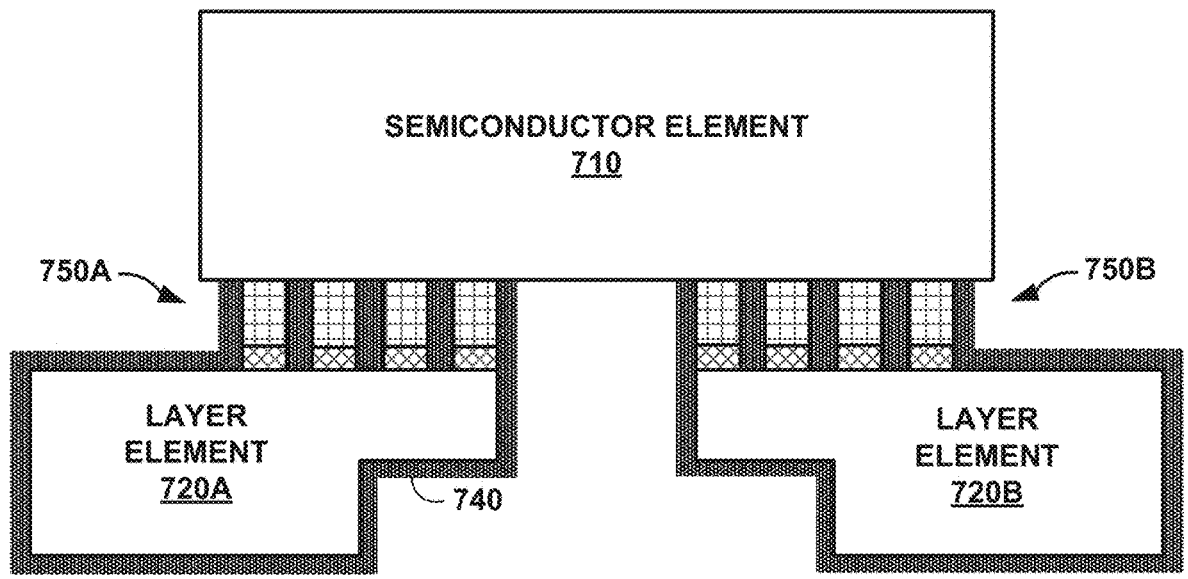
Figure 7C:
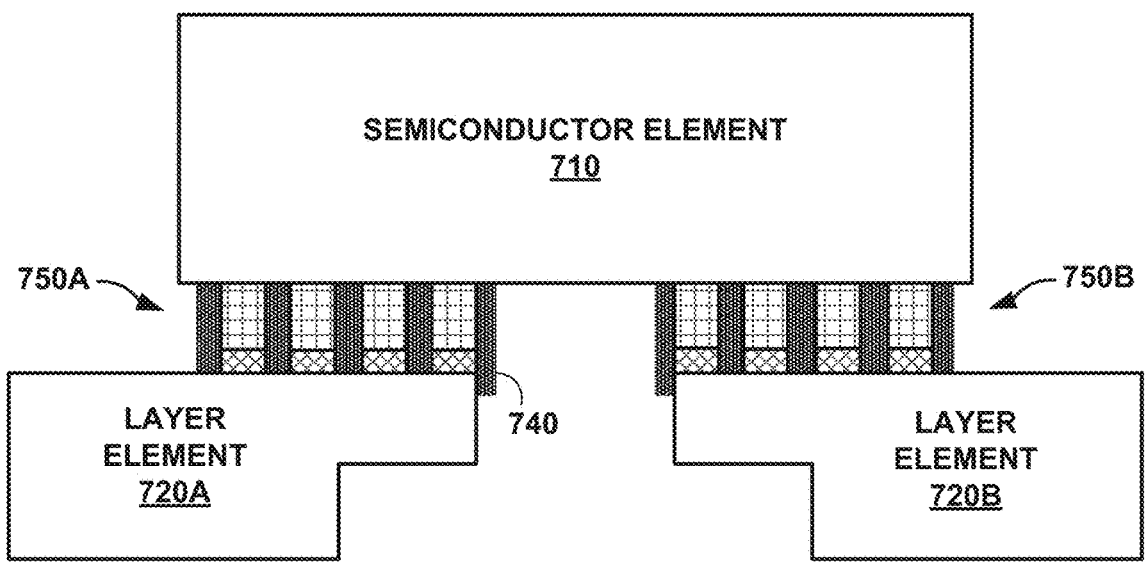

As compared to each of small pillars 730A-730H in FIGS. 7A-7C, each of pillars 630A and 630B may have relatively large cross-sectional area. During the soldering process, the stress to semiconductor element 610 may be proportional to the cross-sectional area of each of pillars 6:30A and 6:30B. Thus, the attachment of each of pillars 630A and 630B may cause more stress to semiconductor element 610 than the attachment of each of pillars 730A-730H may cause more stress to semiconductor element 710. Pillars 630A and 630B may include a more malleable material such as solder, which may result in lower stress during the attachment process, but the solder will have higher resistivity than a harder material such as copper.

FIGS. 7A-7C are conceptual block diagrams of eight smaller pillars 730A-730H electrically connecting a semiconductor element 710 and two layer elements 720A and 720B, in accordance with some examples of this disclosure. FIG. 7B depicts conductive material 740 formed on pillars 730A-730H and layer elements 720A and 720B. FIG. 7C depicts conductive material 740 formed on pillars 730A-730H and only part of layer elements 720A and 720B. Conductive material 740 may not be formed on all of layer elements 720A and 720B in FIG. 7C because parts of layer elements 720A and 720B may have been masked.

Conductive material 740 formed on pillars 730A-730H may have similar electrical, thermal, and mechanical characteristics, as compared to pillars 630A and 630B. However, attaching pillars 730A-730H to semiconductor element 710 and elements 720A and 720B may cause lower stress, as compared to attaching pillars 630A and 630B to semiconductor element 610 and elements 620A and 620B. The lower stress may be the result of the smaller contact area of pillars 730A-730H, as compared to the contact area of pillars 630A and 630B. The techniques of FIGS. 7A-7C may also be implemented on connector elements such as wires, conductive bumps, and conductive balls.

In some examples, the diameter of each of pillars 730A-730H may be between thirty micrometers and one hundred micrometers or between forty micrometers and seventy micrometers. The depth of conductive material 740 may be between thirty micrometers and eighty micrometers or between forty micrometers and sixty micrometers to form connector element 750 with cross-sectional dimensions of approximately three, four, or five hundred micrometers by one or two hundred micrometers.

Figure 8A:
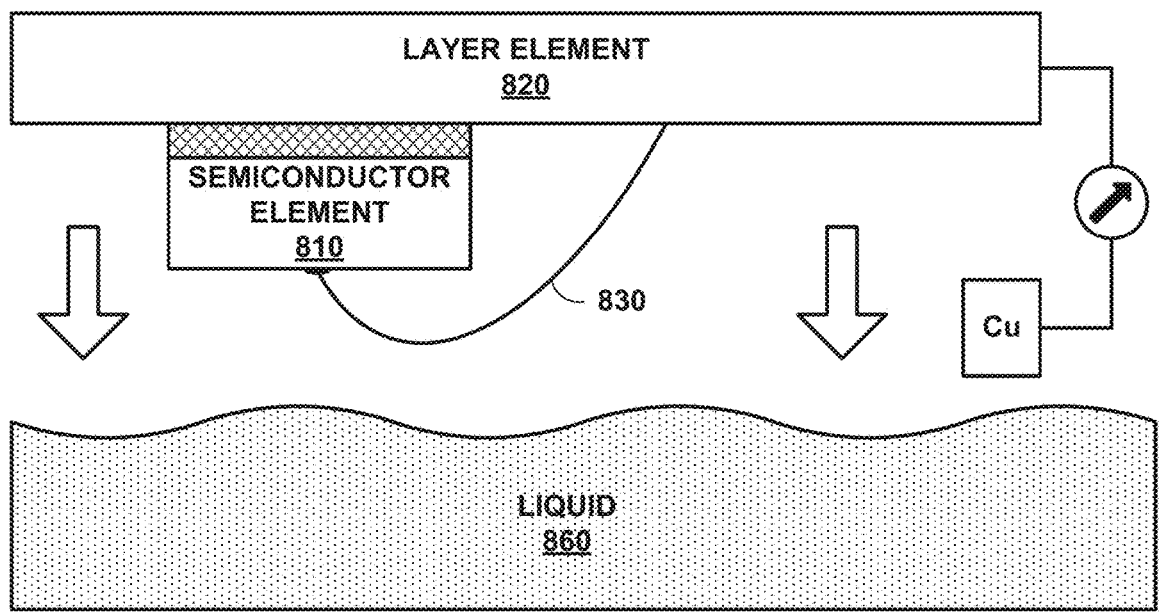
FIGS. 8A and 8B are conceptual block diagrams of an electrolytic process to attach conductive material to a wire bond, in accordance with some examples of this disclosure.
Figure 8B:
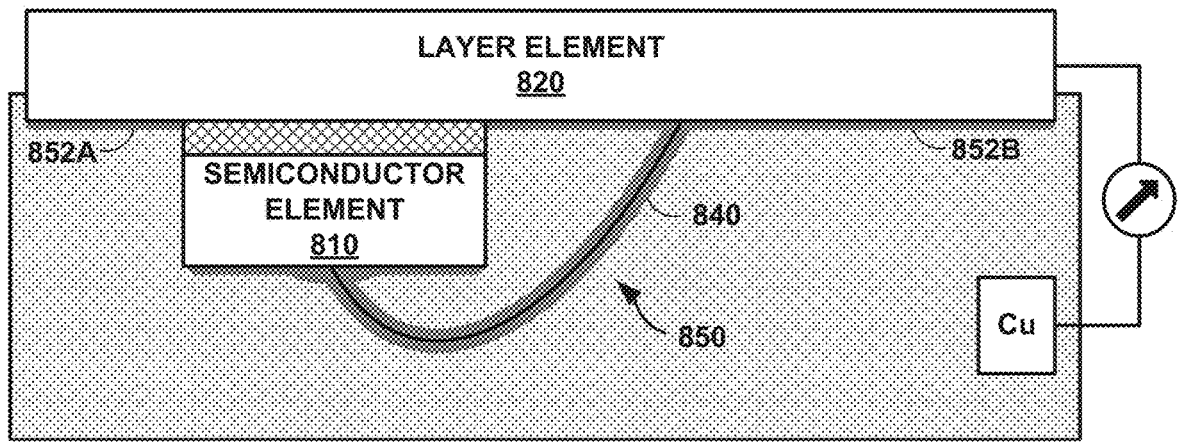

FIGS. 8A and 8B are conceptual block diagrams of an electrolytic process to attach conductive material 840 to a wire bond, in accordance with some examples of this disclosure. Conductive material 840 may be formed on connector element 830 by an electro-plating process, such as electroplating, and/or an electroless process. FIGS. 8A and 8B depict a process without masking of layer element 820, such that conductive material 852A and 852B may form on the unmasked surface of layer element 820.

The bonded carrier (e.g., layer element 820) can be optionally masked in order to avoid any unwanted plating layers. Layer element 820 may be electrically connected to a first electrode, in the case of electroplating, and dipped into the plating bath of liquid 860, which is connected to a second electrode. Liquid 860 may include copper or any other plate-able material, and liquid 860 may coat connector element(s) 830 to form connector element 850. The plating of conductive material 840 (e.g., copper) may reinforce connector element(s) 830. In the case of multiple wires on a single bond pad on element 810 or 820, the wires may grow together to generate a single interconnect band (e.g., a single connector element).

Figure 9A:
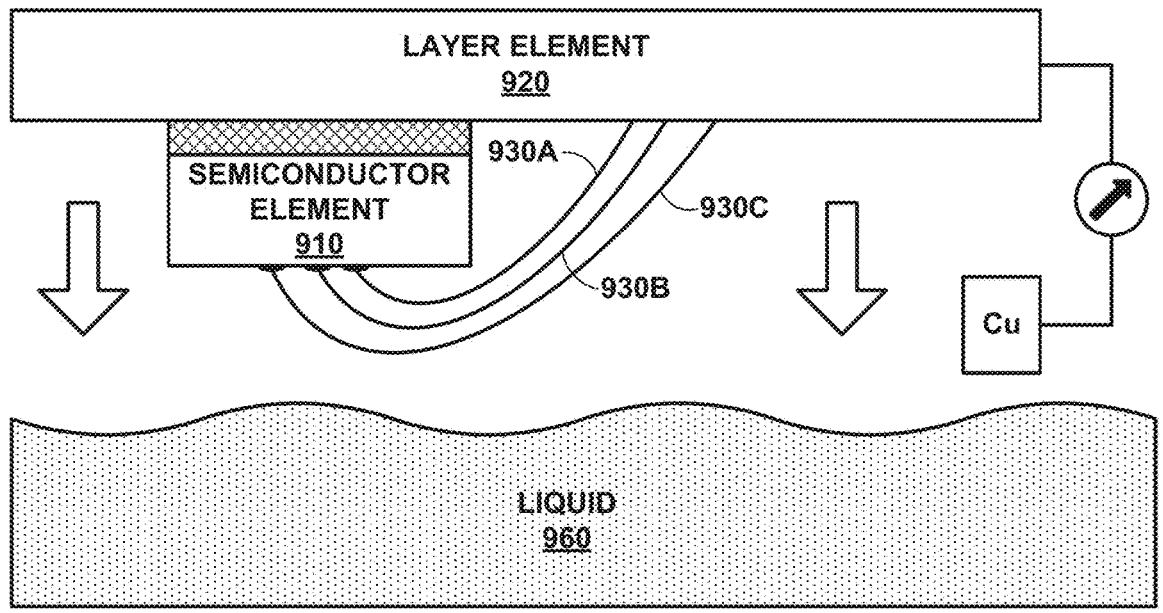
FIGS. 9A and 9B are conceptual block diagrams of forming a single connector element by an electrolytic process, in accordance with some examples of this disclosure.
Figure 9B:
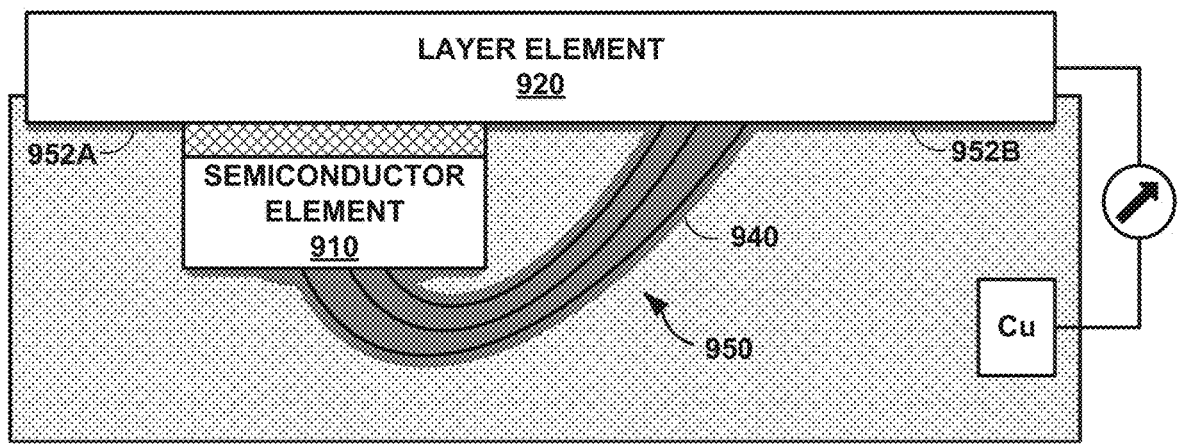

FIGS. 9A and 9B are conceptual block diagrams of forming a single connector element 950 by an electrolytic process, in accordance with some examples of this disclosure. During the electrolytic process, liquid 960 may form into conductive material 940 on discrete connector elements 930A-930C to create single connector element 950. Liquid 960 may also form on layer element 920 to form conductive material 952A and 952B. The addition of conductive material 952A and 952B to layer element 920 may reduce the likelihood of corrosion on layer element 920.

Figure 10A:
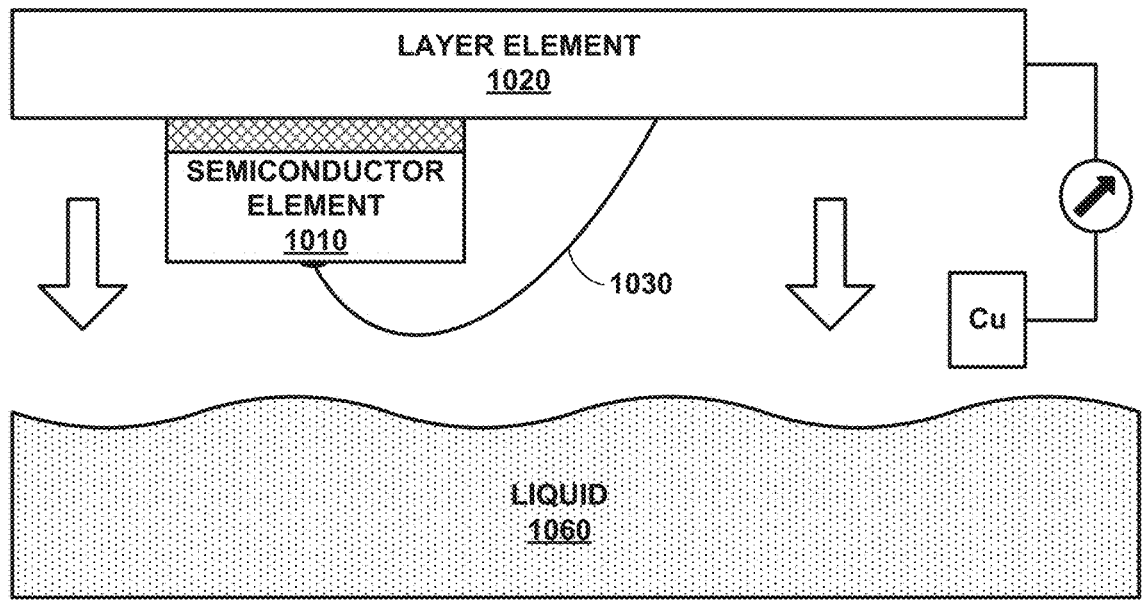
FIGS. 10A and 10B are conceptual block diagrams of masking a layer element before using an electrolytic process to attach conductive material to a wire bond, in accordance with some examples of this disclosure.
Figure 10B:
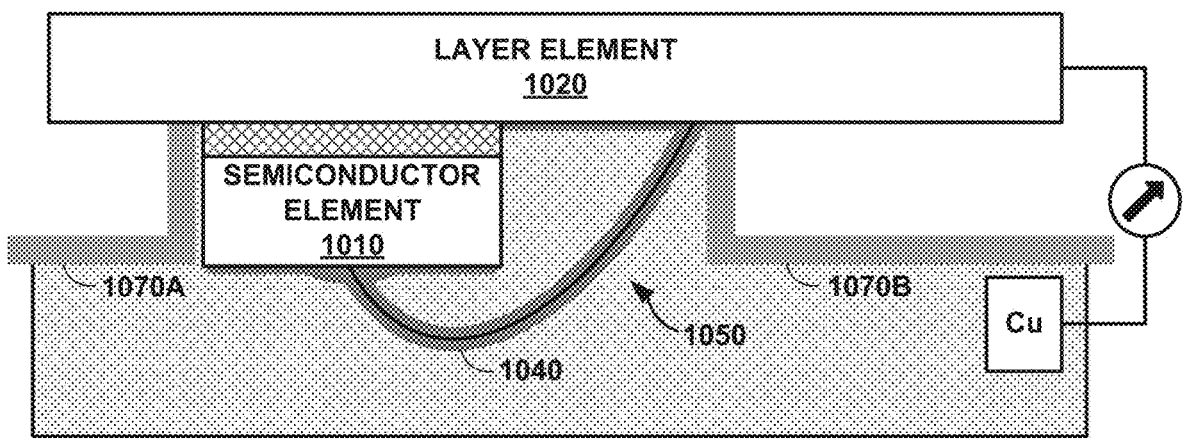

FIGS. 10A and 10B are conceptual block diagrams of masking a layer element 1020 before using an electrolytic process to attach conductive material 1040 to a wire bond 1030, in accordance with some examples of this disclosure. Masks 1070A and 1070B may cover layer element 1020 to prevent the formation of conductive material 1040 on part or all of layer element 1020. Masks 1070 and 1070B may be removed after the plating process is complete.

Figure 11:
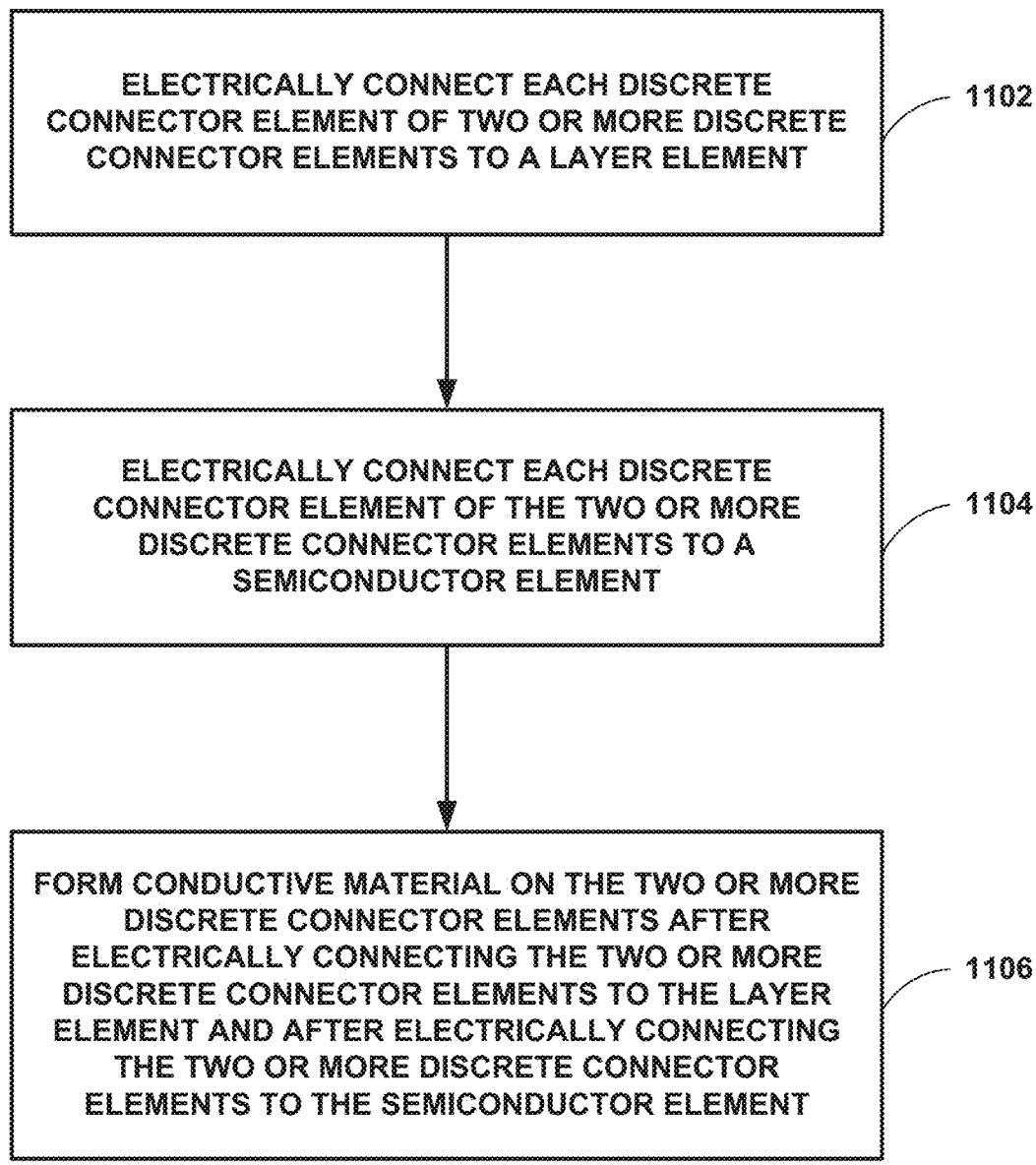
FIG. 11 is a flowchart illustrating example techniques for forming a single connector element, in accordance with some examples of this disclosure.

FIG. 11 is a flowchart illustrating example techniques for forming a single connector element, in accordance with some examples of this disclosure. The techniques of FIG. 11 are described with reference to device 100 in FIG. 1, although other components, such as devices 200, 300, 500, and 700 in FIGS. 2A, 2B, 3A-3C, 5, and 7A-7C may exemplify similar techniques.

In the example of FIG. 11, discrete connector elements 130A and 130B are electrically connected to layer element 120 (1102), and discrete connector elements 130A and 130B are electrically connected to semiconductor element 110 (1104). Discrete connector elements 130A and 130B may be attached to layer element 120 by wire bonding, soldering, gluing, taping, etc. Discrete connector elements 130A and 130B may include a wire, a metal pillar, a bump, a ball, or any other connector element. Discrete connector elements 130A and 130B may include material such as copper, solder, gold, aluminum, nickel, silver, etc.

The attachment process for discrete connector elements 130A and 130B may cause stress to semiconductor element 110 that is proportional to the surface area of discrete connector elements 130A and 130B in contact with semiconductor element 110. Thus, the attachment of a very thin wire to semiconductor element 110 will cause lower stress than the attachment of a relatively thick wire.

In the example of FIG. 11, conductive material 140 is formed on discrete connector elements 130A and 130B after discrete connector elements 130A and 130B are electrically connected to elements 110 and 120 (1106). The formation process may include an electrolytic process such as electroplating or an electroless process such as electroless plating. Conductive material 140 may include copper, nickel, silver, or any other conductive material. Single connector element 150 may have improved electrical characteristics (e.g., lower resistance and lower power dissipation), better thermal characteristics (e.g., higher thermal conductivity), and better mechanical characteristics (e.g., higher tensile strength), as compared to discrete connector element 130A and 130B.

Together, discrete connector elements 130A and 130B and conductive material 140 may form single connector element 150 with a larger cross-sectional area than discrete connector elements 130A and 130B. In some examples, single connector element 150 may include more than one discrete connector element with conductive material 140 formed around the discrete connector elements. Conductive material

140 may fill in the gaps between the discrete connector elements such that electricity can flow between the discrete connector elements without having to flow to element 110 or 120.

Thus, conductive material 140 may create a direct electrical connection between a first discrete connector element and a second discrete connector element. The direct electrical connection may allow electricity to flow between the first discrete connector element and the second discrete connector element without flowing through a pad on semiconductor element 110 or through layer element 120. Conductive material 140 may also form an electrical connection between elements 110 and 120 that is separate from discrete connector elements 130A and 130B such that electricity can flow from element 110 to element 120 through only conductive material 140 without touching discrete connector elements 130A and 130B.

In some examples, conductive material 140 may have relatively low resistivity (e.g., copper plating). Discrete connector elements 130A and 130B may include a material with relatively low hardness (e.g., gold or aluminum), whereas copper may be a harder material. Conductive material 140 may also prevent corrosion (e.g., silver or nickel).

After conductive material 140 has been formed on discrete connector elements 130A and 130B, any masking on elements 110 or 120 may be removed. Then, an encapsulating material may be formed around elements 110, 120 and 150 to prevent movement of elements 110, 120 and 150.

The following numbered examples demonstrate one or more aspects of the disclosure.

Example 1

A device includes a semiconductor element, a layer element, and a single connector element electrically connecting the semiconductor element and the layer element. The single connector element includes two or more discrete connector elements, and each discrete connector element of the two or more discrete connector elements electrically connects the semiconductor element and the layer element. The single connector element also includes conductive material attached to the two or more discrete connector elements.

Example 2

The device of example 1, wherein the conductive material fills a gap between the two or more discrete connector elements.

Example 3

The device of examples 1-2 or any combination thereof, wherein the conductive material electrically connects a first discrete connector element of the two or more discrete connector elements and a second discrete connector element of the two or more discrete connector elements.

Example 4

The device of examples 1-3 or any combination thereof, wherein the conductive material electrically connects the semiconductor element and the layer element.

Example 5

The device of examples 1-4 or any combination thereof, wherein the single connector element includes the conductive material between and around each discrete connector element of the two or more discrete connector elements.

Example 6

The device of examples 1-5 or any combination thereof, wherein conductive material is a first layer of conductive material attached to the two or more discrete connector elements. The single connector element further includes a second layer of conductive material attached to the first layer of conductive material, and wherein the second layer of conductive material includes nickel or silver.

Example 7

The device of examples 1-6 or any combination thereof, wherein the conductive material includes copper plating attached to the two or more discrete connector elements and formed by an electrolytic process.

Example 8

The device of examples 1-7 or any combination thereof, wherein each discrete connector element of the two or more discrete connector elements comprises a wire bond.

Example 9

The device of examples 1-8 or any combination thereof, wherein each discrete connector element of the two or more discrete connector elements comprises a metal pillar.

Example 10

The device of examples 1-9 or any combination thereof, wherein the two or more discrete connector elements comprise gold, aluminum, or copper.

Example 11

The device of examples 1-10 or any combination thereof, further comprising conductive material attached to a surface of the layer element.

Example 12

The device of examples 1-11 or any combination thereof, wherein the semiconductor element includes a pad, wherein the single connector element electrically connects the pad to the layer element.

Example 13

The device of examples 1-12 or any combination thereof, wherein the semiconductor element includes gallium nitride.

Example 14

The device of examples 1-13 or any combination thereof, wherein the layer element includes a metal carrier, a laminate substrate, a ceramic, a direct-copper-bonded substrate, an active-metal-brazing substrate, a molded interconnect substrate, or a printed circuit board.

Example 15

A method includes electrically connecting each discrete connector element of two or more discrete connector elements to a layer element. The method also includes electrically connecting each discrete connector element of the two or more discrete connector elements to a semiconductor element. The method further includes forming conductive material on the two or more discrete connector elements after electrically connecting the two or more discrete connector elements to the layer element and after electrically connecting the two or more discrete connector elements to the semiconductor element. Forming the conductive material comprises forming a single connector element to electrically connect the semiconductor element and the layer element.

Example 16

The method of example 15, wherein forming the conductive material on the two or more discrete connector elements comprises forming, by an electrolytic process or by an electroless process, a layer of copper on the two or more discrete connector elements.

Example 17

The method of examples 15-16 or any combination thereof, further comprising forming conductive material on at least part of the layer element.

Example 18

The method of examples 15-17 or any combination thereof, further comprising masking at least part of the layer element before forming the conductive material on the two or more discrete connector elements.

Example 19

The method of examples 15-18 or any combination thereof, wherein forming the conductive material on the two or more discrete connector elements comprises forming a first layer of conductive material on the two or more discrete connector elements. The method further includes forming a second layer of conductive material on the first layer of conductive material, wherein the second layer of conductive material includes nickel or silver.

Example 20

The method of examples 15-19 or any combination thereof, wherein forming the single connector element comprises filling a gap between a first discrete connector element of the two or more discrete connector elements and a second discrete connector element of the two or more discrete connector elements Example 21

The method of examples 15-20 or any combination thereof, wherein forming the single connector element comprises forming a direct electrical connection between a first discrete connector element of the two or more discrete connector elements and a second discrete connector element of the two or more discrete connector elements.

Example 22

The method of examples 15-21 or any combination thereof, wherein forming the conductive material on each discrete connector element of the two or more discrete connector elements includes forming a first layer of conductive material on the discrete connector element. Forming the single connector element further includes forming a second layer of conductive material on the first layer of conductive material, and the second layer of conductive material includes nickel or silver.

Example 23

A device includes a semiconductor element, a layer element, and a single connector element electrically connecting the semiconductor element and the layer element. The single connector element includes two or more discrete connector elements, wherein each discrete connector element of the two or more discrete connector elements is electrically connected to a pad on the semiconductor element and electrically connected to the layer element. The single connector element includes conductive material formed on each discrete connector element of the two or more discrete connector elements, the pad on the semiconductor element, and the layer element.

Example 24

The device of example 23, wherein the conductive material comprises a first layer of conductive material. The device further includes a second layer of conductive material formed on the first layer of conductive material.

Various examples of the disclosure have been described. Any combination of the described systems, operations, or functions is contemplated. These and other examples are within the scope of the following claims.

What is claimed is:
1. A device comprising:
a semiconductor element;
a layer element; and
a single connector element electrically connecting the semiconductor element and the layer element, wherein the single connector element includes:
two or more discrete connector elements, wherein each discrete connector element of the two or more discrete connector elements electrically connects the semiconductor element and the layer element, wherein each discrete connector element of the two or more discrete connector elements includes a first end, a second end, and a body between the first end and the second end; and
conductive material attached to the two or more discrete connector elements, wherein the conductive material directly connects the body of a first discrete connector element of the two or more discrete connector elements and the body of a second discrete connector element of the two or more discrete connector elements, and
wherein the conductive material electrically connects the semiconductor element and the layer element.
2. The device of claim 1, wherein the conductive material fills a gap between the two or more discrete connector elements.
3. The device of claim 1, wherein the single connector element includes the conductive material between and around each discrete connector element of the two or more discrete connector elements.

4. The device of claim 1,
wherein the conductive material is a first layer of the conductive material attached to the two or more discrete connector elements,
wherein the single connector element further includes a second layer of the conductive material attached to the first layer of
the conductive material, and wherein the second layer of the conductive material includes nickel or silver.

5. The device of claim 1, wherein the conductive material includes copper plating attached to the two or more discrete connector elements and formed by an electrolytic process.

6. The device of claim 1, wherein the two or more discrete connector elements comprise gold, aluminum, or copper.

7. The device of claim 1,
further comprising additional conductive material attached to a surface of the layer element.

8. The device of claim 1, wherein the semiconductor element includes gallium nitride.

9. The device of claim 1, wherein the layer element includes a metal carrier, a laminate substrate, a ceramic, a direct-copper-bonded substrate, an active-metal-brazing substrate, a molded interconnect substrate, or a printed circuit board.

10. The device of claim 1,
wherein the conductive material is in physical contact with the first discrete connector element and with the second discrete connector element, and
wherein electricity can flow from the first discrete connector element to the second discrete connector element through only the conductive material.

11. A method comprising:
electrically connecting a first end of each discrete connector element of two or more discrete connector elements to a layer element;
electrically connecting a second end of each discrete connector element of the two or more discrete connector elements to a semiconductor element, wherein each discrete connector element of the two or more discrete connector elements includes a body between the first end and the second end; and
forming conductive material on the two or more discrete connector elements after electrically connecting the two or more discrete connector elements to the layer element and after electrically connecting the two or more discrete connector elements to the semiconductor element,
wherein the conductive material electrically connects the semiconductor element and the layer element, and
wherein forming the conductive material comprises:
forming a single connector element to electrically connect the semiconductor element and the layer element; and
forming a direct electrical connection between the body of a first discrete connector element of the two or more discrete connector elements and the body of a second discrete connector element of the two or more discrete connector elements such that the conductive material directly connects the body of a first discrete connector element of the two or more discrete connector elements and the body of a second discrete connector element of the two or more discrete connector elements.

12. The method of claim 11, wherein forming the conductive material on the two or more discrete connector elements comprises forming, by an electrolytic process or by an electroless process, a layer of copper on the two or more discrete connector elements.

13. The method of claim 11,
further comprising forming additional conductive material on at least part of the layer element.

14. The method of claim 11, further comprising masking at least part of the layer element before forming the conductive material on the two or more discrete connector elements.

15. The method of claim 11,
wherein forming the conductive material on the two or more discrete connector elements comprises forming a first layer of conductive material on the two or more discrete connector elements,
wherein the method further comprises forming a second layer of conductive material on the first layer of conductive material, and
wherein the second layer of conductive material includes nickel or silver.

16. The method of claim 11, wherein forming the single connector element comprises filling a gap between the first discrete connector element of the two or more discrete connector elements and the second discrete connector element of the two or more discrete connector elements.

17. A device comprising:
a semiconductor element;
a layer element; and
a single connector element electrically connecting the semiconductor element and the layer element, wherein the single connector element includes:
two or more discrete connector elements, wherein each discrete connector element of the two or more discrete connector elements is electrically connected to a pad on the semiconductor element and electrically connected to the layer element, wherein each discrete connector element of the two or more discrete connector elements includes a first end, a second end, and a body between the first end and the second end; and
conductive material formed on each discrete connector element of the two or more discrete connector elements, the pad on the semiconductor element, and the layer element,
wherein the conductive material directly connects the body of a first discrete connector element of the two or more discrete connector elements and the body of a second discrete connector element of the two or more discrete connector elements,
wherein the conductive material is in physical contact with the first discrete connector element and with the second discrete connector element, and
wherein electricity can flow from the first discrete connector element to the second discrete connector element through only the conductive material.

18. The device of claim 17,
wherein the conductive material comprises a first layer of conductive material, and
wherein the device further comprises a second layer of conductive material formed on the first layer of conductive material.

19. A device comprising:
a semiconductor element;
a layer element; and
a single connector element electrically connecting the semiconductor element and the layer element, wherein the single connector element includes:
two or more discrete connector elements, wherein each discrete connector element of the two or more discrete connector elements electrically connects the semiconductor element and the layer element, wherein each discrete connector element of the two or more discrete connector elements includes a first end, a second end, and a body between the first end and the second end;
a first layer of conductive material attached to the two or more discrete connector elements, wherein the first layer of conductive material directly connects the body of a first discrete connector element of the two or more discrete connector elements and the body of a second discrete connector element of the two or more discrete connector elements; and
a second layer of conductive material attached to the first layer of conductive material, wherein the second layer of conductive material includes nickel or silver.

20. A device comprising:
a semiconductor element;
a layer element; and
a single connector element electrically connecting the semiconductor element and the layer element, wherein the single connector element includes:
two or more discrete connector elements, wherein each discrete connector element of the two or more discrete connector elements electrically connects the semiconductor element and the layer element, wherein each discrete connector element of the two or more discrete connector elements includes a first end, a second end, and a body between the first end and the second end; and
conductive material attached to the two or more discrete connector elements, wherein the conductive material directly connects the body of a first discrete connector element of the two or more discrete connector elements and the body of a second discrete connector element of the two or more discrete connector elements, and wherein the conductive material includes copper plating attached to the two or more discrete connector elements and formed by an electrolytic process.

* * * * *